United States Patent
Nakamura

(10) Patent No.: US 7,453,332 B2
(45) Date of Patent: Nov. 18, 2008

(54) MECHANICAL RESONATOR

(75) Inventor: Kunihiko Nakamura, Sagamihara (JP)

(73) Assignee: Panasonic Corporation, Osaka (JP)

(*) Notice: Subject to any disclaimer, the term of this patent is extended or adjusted under 35 U.S.C. 154(b) by 309 days.

(21) Appl. No.: 10/538,319

(22) PCT Filed: Mar. 24, 2004

(86) PCT No.: PCT/JP2004/004091

§ 371 (c)(1),
(2), (4) Date: Mar. 22, 2006

(87) PCT Pub. No.: WO2004/086617

PCT Pub. Date: Oct. 7, 2004

(65) Prior Publication Data

US 2006/0214746 A1    Sep. 28, 2006

(30) Foreign Application Priority Data

Mar. 25, 2003 (JP) ............................. 2003-082430
Mar. 16, 2004 (JP) ............................. 2004-074288

(51) Int. Cl.
*H03H 9/46* (2006.01)
*H03H 9/52* (2006.01)
(52) U.S. Cl. ...................................... 333/186; 333/200
(58) Field of Classification Search .................. 333/186
See application file for complete search history.

(56) References Cited

U.S. PATENT DOCUMENTS 3,634,787 A * 1/1972 Newell ........................ 333/186
6,624,726 B2 * 9/2003 Niu et al. ..................... 333/197
6,686,807 B1   2/2004 Giousouf et al.
6,909,221 B2 * 6/2005 Ayazi et al. .................. 310/321
2003/0052742 A1   3/2003 Niu et al.

FOREIGN PATENT DOCUMENTS

JP    10-312734 A    11/1998
JP    2000-030595 A   1/2000

(Continued)

OTHER PUBLICATIONS

William C. Tang, et al., "Laterally Driven Polysilicon Resonant Microstructures", University of California at Berkely Department of Electrical Engineering and Computer Sciences and the Electronics Research Laboratory, IEEE, Feb. 20, 1989, pp. 53-59.

(Continued)

*Primary Examiner*—Barbara Summons
(74) *Attorney, Agent, or Firm*—RatnerPrestia

(57) ABSTRACT

A mechanical resonator is constructed such that it has a vibration body that performs a mechanical resonant vibration and also has an electrode located in the vicinity of the vibration body and such that it is shaped into the surface shape of the electrode when deformed during a resonance mode of the vibration body, whereby the electrostatic capacitance change per unit vibration displacement amount can be enlarged. In this way, a mechanical resonator can be realized which performs an effective electricity-to-machine or machine-to-electricity conversion. Moreover, this mechanical resonator can be used to realize a small-sized, high-performance filter circuit or switch circuit in a high-density integrated electrical circuit.

6 Claims, 15 Drawing Sheets

FOREIGN PATENT DOCUMENTS

| | | |
|---|---|---|
| JP | 2000-311572 A | 11/2000 |
| JP | 2000-348593 A | 12/2000 |
| JP | 2001-502247 A | 2/2001 |
| JP | 2001-308677 A | 11/2001 |
| JP | 2001-320100 A | 11/2001 |
| JP | 2002-535865 A | 10/2002 |
| WO | WO 02/17482 A2 | 2/2002 |

OTHER PUBLICATIONS

Supplementary European Search Report for EP 04 72 3030, dated Feb. 10, 2006.

Stiffness-Compensated Temperature-Insensitive Micromechanical Resonators, Wan-Thai Hsu and Clark T.-C. Nguyen, Micro Electro Mechanical Systems, 2002, The Fifteenth IEEE International Conference on, Jan. 20-24, 2002, pp. 731-734.

High-Q HF Microelectromechanical Filters, Frank D. Bannon, III, John R. Clark, and Clark T.-C. Nguyen, IEEE Journal of Solid-State Circuits, vol. 35. No. 4, Apr. 2000, pp. 512-526.

International Search Report for application No. PCT/JP2004/004091 dated Jun. 22, 2004.

\* cited by examiner

MECHANICAL RESONATOR

This Application is a U.S. National Phase Application of PCT International Application PCT/JP2004/004091.

TECHNICAL FIELD

The present invention relates to mechanical resonators, and more particularly to those for realizing a small-sized, high-performance filter circuit or switch circuit in a densely integrated electric circuit.

BACKGROUND ART

With reference to FIG. 22, explanation is made on the mechanical resonator in the prior art. FIG. 22 is a view showing, with simplification, a structure of a mechanical vibration filter introduced in the document, Frank D. Bannon III, John R. Clark, and Clark T.-C. Nguyenc, "High-Q HF Microelectromechanical Filters" (IEEE Journal of Solid-State Circuits, Vol. 35, No. 4, pp. 512-526, April 2000).

This filter is formed with a thin film formed over a silicon substrate. The structure is with an input line 104, an output line 105, both-end-supported beams 101, 102 arranged with a spacing of 1 micron or less to the lines, and a joint beam 103 joining the two beams together. The signal inputted at the input line 104 is capacitively coupled with the beam 101, to cause an electrostatic force on the beam 101. Mechanical vibration is caused only when the signal frequency agrees with or is very close to the resonant frequency of the elastic structure formed by the beams 101, 102 and the joint beam 103. By detecting the mechanical vibration as a change of capacitance between the output line 105 and the beam 102, a filtered output of the input signal can be withdrawn.

When taking elasticity E, density $\rho$, thickness h and length L for a both-end-supported beam having a rectangular section, the resonant frequency f is given by the following equation.

$$f = 1.03 \frac{h}{L^2} \sqrt{\frac{E}{\rho}} \quad (1)$$

Provided that the material is polysilicon, E=160 GPa and $\rho=2.2\times10^3$ kg/cm$^3$ result. Meanwhile, provided that the dimensions are L=40 μm and h=1.5 μm, f=8.2 MHz results. Thus, a filter at approximately 8 MHz can be structured. The use of mechanical resonance makes it possible to obtain a sharp frequency selective characteristic having a high Q value as compared to the filter constituted by a passive circuit, such as a capacitor and a coil.

However, the conventional structure encounters a restriction in constituting a higher-frequency band filter. Namely, it is clear from (equation 1) that, firstly, E/$\rho$ is to be increased by changing the material. However, when E is taken greater, the displace amount of the beam decreases even at the equal force deforming the beam, which makes it difficult to detect a displacement of the beam. Meanwhile, in case the index representative of a beam bendability is taken d/L that is a ratio of a deformation amount d at the center of the both-end-supported beam and a beam length L where a static load is applied to a surface of the beam, d/L is expressed by the following proportional relationship.

$$\frac{d}{L} \propto \frac{L^3}{h^3} \cdot \frac{1}{E} \quad (2)$$

From those, in order to raise the resonant frequency while keeping the value of d/L, a material with a low density $\rho$ must be sought because at least E cannot be changed. There is a need to use a composite material, such as CFRP (carbon fiber reinforced plastics), as a material equivalent in Young's modulus to polysilicon and low in density. In this case, there is a difficulty in structuring a microscopic-mechanical-vibration filter by a semiconductor process.

The second method not using such a composite material is to increase h·L$^{-2}$ by changing the beam dimensions in equation 1. However, the increase of h and decrease of L results in a decrease of d/L as an index of deformability, making it difficult to detect a deflection of the beam.

Showing the relationship between a log (L) and a log (h) as to equation 1 and equation 2 in FIG. 23, straight line 191 is a relationship to be determined from equation 1 while straight line 192 is a relationship to be determined from equation 2. In FIG. 23, when selecting L and h in the upper range (area A) than a straight line with an inclination "2" using the current-dimensions point A as a marking point, there is an increase of f while, when selecting L and h in the lower range (area B) of a straight line with an inclination "1", there is an increase of d/L. Accordingly, the hatched region (area C) is a range of L and h where the resonant frequency can be raised while securing the amount of beam deformation.

It is clear from FIG. 23 that size reduction in both L and h is a necessary condition for increasing the frequency of a mechanical vibration filter. Meanwhile, size reduction of L and h at the same scaling, i.e. decreasing L and h while lying on the straight line having the inclination 1, is a sufficient condition for the hatched region in FIG. 23.

In this manner, in the conventional mechanical resonator, the resonant frequency can be raised by reducing the dimensions of the mechanical vibration body. Nevertheless, the vibration-detecting signal is unavoidably weakened because of decreased beam vibration. Thus, there is a problem of being readily susceptible to disturbance.

DISCLOSURE OF THE INVENTION

It is an object of the present invention to provide a miniaturized mechanical resonator realizing the performance improvement of a circuit component, such as a filter.

The present invention, for solving the problem, provides a structure for efficiently converting an electrical signal into a mechanical vibration or a structure for efficiently converting a mechanical vibration into an electric signal by increasing capacitance change per unit displacement amount of a resonant-vibrating vibration body as the result of an electrode with a surface shape deformed in a resonance mode of the vibrating body.

A mechanical resonator according to a first form of the invention comprises: a vibration body operable to perform a mechanical resonant vibration; and an electrode located in a vicinity of the vibration body, a surface of the electrode adjacent to the vibration body having a curved shape in a direction an amplitude of the resonant vibration of the vibration body. This increases the capacitance change per unit displacement amount of a vibration body in resonant vibration, thus the structure provides efficient conversion of an electric signal into a mechanical vibration or efficient conversion of a mechanical vibration into an electric signal.

Meanwhile, according to a mechanical resonator of a second form of the invention, the curved surface of the electrode in the first form has a same surface shape as a shape of the vibration body deformed in a resonance mode. Due to this, because the capacitance of the vibration body can be increased to a maximum limit, the capacitance change per unit displacement amount of the vibration body in resonant vibration can be increased. Thus the structure provides efficient conversion of an electrical signal into a mechanical vibration or efficiently conversion of a mechanical vibration into an electric signal.

Meanwhile, according to a mechanical resonator of a third form of the invention, the electrode surface adjacent to the vibration body, in either the first or second form of the invention, has an area smaller than a surface area of the vibration body. This can suppress the excessive charge from generating in a capacitive coupling between the vibration body and an electrode, thus enabling a reduction of the alternating current undesirably leaking. Particularly, by avoiding the electrode from being arranged opposed to the vibration body where amplitude attains a maximum during resonance or the vicinity thereof, the relationship between voltage and force and between displacement and current is approximated to the linearity thus making it easy to control. Otherwise, by avoiding an electrode from being arranged opposed to an end of the vibration body, excessive charges can be suppressed from occurring, by a simple structure.

Meanwhile, a mechanical resonator according to a forth form of the invention has a vibration body operable to perform a mechanical resonant vibration and an electrode located in a vicinity of the vibration body and operable to vibrate in a resonance mode at the same resonant frequency as the vibration body. Due to this, the capacitance in the absence of vibration is reduced nearly to that of the parallel-plate structure while the capacitance in the presence of vibration at resonant frequency is maximized as to the vibration body, thus making it possible to increase the value of $|\Delta C/\Delta y|$. As a result, unwanted alternating current is reduced, thus enabling efficient conversion of an electric signal into a mechanical vibration and efficient conversion of a mechanical vibration into an electric signal.

Meanwhile, a mechanical resonator according to a fifth form of the invention further includes a bias power source connected to the vibration body and electrode in the first to fourth forms and operable to cause an electrostatic field between the vibration body and the electrode, whereby the vibration body resonantly vibrates when a voltage change at a resonant frequency is provided to between the vibration body and the electrode. This allows for efficient conversion of an electric signal into a mechanical vibration.

Meanwhile, a mechanical resonator according to a sixth form of the invention further includes a detecting section operable to detect a signal from a voltage change between the electrode and the vibration body in the first to forth form, the detecting section being operable to detect a signal converted from a vibration into an electric signal due to an electrostatic capacitance change between the vibration body and the electrode during vibration of the vibration body. This allows for efficient conversion of a mechanical vibration into an electric signal.

Meanwhile, a mechanical resonator according to a seventh form of the invention is characterized by providing an insulation layer between at least a portion of the electrode and the vibration body, in the first to fourth form. This can avoid an electric short between the vibration body and the electrode.

Particularly, the insulation layer is characterized by being a polymer particle having an insulation and a lubricity. Due to this, because insulation layer thickness is made constant while the fluororesin has a lubricity, the uncontrollable absorption force called stiction can be reduced even when the vibration body is placed in contact with the fluororesin particle.

Meanwhile, a mechanical resonator according to an eighth form of the invention further comprises a second contact electrode arranged on a surface of the vibration body adjacent to the electrode and isolated from the vibration body, and a first contact electrode arranged in a vicinity of the electrode, being isolated from the electrode and being aligned with the second contact electrode in the direction of the resonant vibration of the vibration body, in the first to fourth form of the invention. Due to this, because the vibration body has a dynamic displacement amount due to electrostatic force that is Q-value times the static displacement amount therof, contact electrodse can be put in contact at a small voltage.

Particularly, there is further included a bias power source connected to the vibration body and the electrode and operable to generat an electrostatic field between the vibration body and the electrode, the vibration body being operable to resonantly vibrat when a voltage change is provided between the vibration body and the electrode the vibration body being electrostatically absorbed by a voltage of the bias power source at a time that the second contact electrode comes near the first contact electrode. Due to this, the resonant vibration displacement of the vibration body is controlled in amount to a degree of collision with the electrode. By absorbing the vibration body onto the electrode due to an attraction force of electrostatic force between the vibration body and the electrode in the instance of re-approach, contact-fixing can be provided between the first contact electrode and the second contact electrode, thus realizing a switch function utilizing the same.

Meanwhile, a mechanical resonator according to a ninth form of the invention has a plurality of mechanical resonators according to the first to fourth form of the invention electrically arranged in parallel or in series. It may be characterized that the electrode is to vibrate in a resonance mode at the same resonant frequency as the vibration body.

By thus properly adjusting the number of filters, it is possible to reduce the reflection signal caused by impedance mismatching problematic particularly in a radio frequency circuit and hence to efficiently convert an electric signal into a mechanical vibration and extract a mechanical vibration again as an electric signal.

Meanwhile, a mechanical resonator according to a tenth form of the invention is characterized by accommodating a mechanical resonator according to the first to ninth form of the invention within a case sealing atmosphere at vacuum. This can raise the Q-value because of the capability of excluding the damping effect upon the vibration body due to air viscosity.

Meanwhile, a filter according to an eleventh form of the invention is characterized by using a mechanical resonator according to the first to seventh form of the invention.

Meanwhile, a switch according to a twelfth form of the invention is characterized by using a mechanical resonator according to the eighth form of the invention.

Meanwhile, an electric circuit according to a thirteenth form of the invention uses a mechanical resonator according to the first to twelfth form of the invention.

As described above, the present invention can realize a structure for effectively converting an electric signal into a mechanical vibration and a structure for effectively converting a mechanical vibration into an electric signal. Meanwhile, it is possible to realize a small-sized, high-performance filter circuit and switch circuit in a densely-integrated electric circuit by use of a mechanical resonator of the invention.

BEST MODE FOR CARRYING OUT THE INVENTION

Using FIGS. 1 to 21, explanations will be now made on embodiments of the present invention.

Embodiment 1

Figure 1:
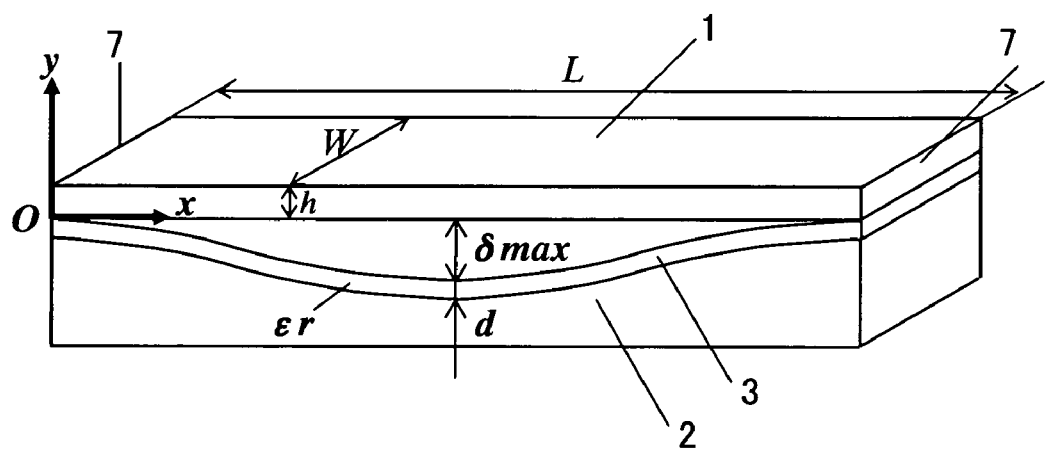
FIG. 1 is a schematic view showing a structure of a mechanical resonator having an electrode surface in a shape made as a primary resonance mode waveform of beam flexural vibration, according to one embodiment of the invention.

FIG. 1 is a schematic view of a mechanical resonator according to embodiment 1 of the invention.

In FIG. 1, a vibration body 1 is a both-end-supported beam having both ends provided as fixed ends 7, having a thickness h, a width W and a length L. An electrode 2 is provided in proximity to the vibration body 1. On the surface of the electrode 2, there is provided an insulation layer 3 having a thickness d and a relative dielectric constant εr in order to avoid electric short due to a contact of the both. At this time, in the case of utilizing a flexural vibration primary resonance mode of the vibration body 1 as a both-end-supported beam, the shape of the vibration body 1 in a primary resonance mode is expressed by the following equation with the use of an x-y coordinate in the figure.

$$y(x) = y_{max}\left[\frac{1}{1.6164}\{\varsigma(\cos\kappa x - \cosh\kappa x) + \sin\kappa x - \sinh\kappa x\}\right] \quad (3)$$

$$\varsigma = -1.01781, \quad k = 4.730/L$$

Note that the maximum value ymax (at x=2/L) is to be determined from the magnitude of an excitation force applied to the vibration body, the heat loss at the inside of the vibration body, the viscosity of ambient air, and so on.

Meanwhile, each of the electrode 2 and insulation layer 3 has a surface in a moderate concave form having a shape of Equation 3, wherein the depth δmax is taken greater than a vibration amplitude ymax of the vibration body 1. Specifically, the surface shape of the electrode 2 is established as in the following equation.

$$y(x) = -\delta_{max}\left[\frac{1}{1.6164}\{\varsigma(\cos\kappa x - \cosh\kappa x) + \sin\kappa x - \sinh\kappa x\}\right] - d \quad (4)$$

Note that there is no need to provide the insulation layer 3 unless assuming a contact between the vibration body and the electrode due to an excessive vibration force, etc.

Figure 2:
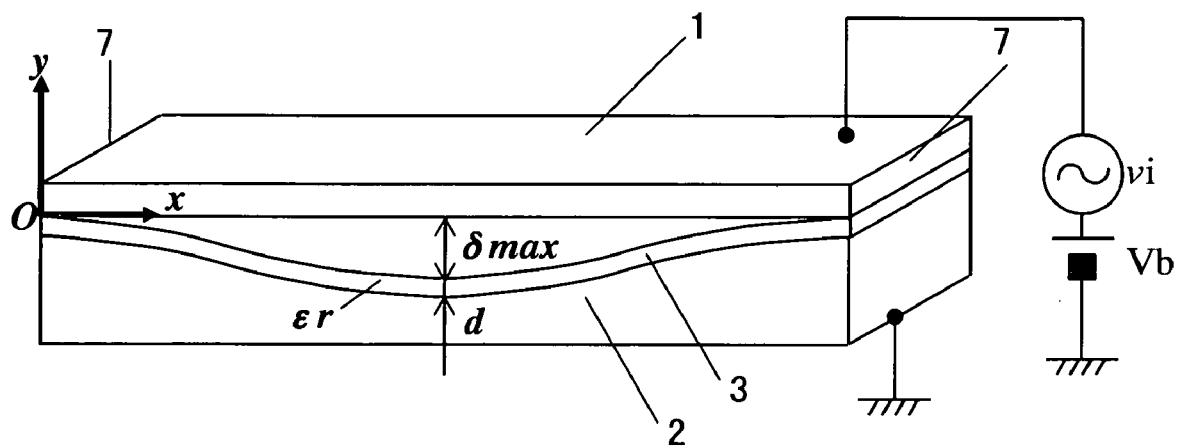
FIG. 2 is a schematic view showing a structure of an electricity-to-machine converter, according to one embodiment of the invention.

FIG. 2 is a case that the mechanical resonator in FIG. 1 is used for electricity-to-machine conversion wherein a bias voltage Vb and alternating current vi (vi<<Vb) is applied between the vibration body 1 and the electrode 2. Considering the elastic vibration of the vibration body 1 by replacing it as a spring mass system having an equivalent mass m, the mass is applied with an electrostatic force expressed by the following equation:

$$F = -\frac{1}{2}\frac{\partial C}{\partial y}(V_b + V_i)^2 \cong -\frac{1}{2}\frac{\partial C}{\partial y}(V_b^2 + 2V_bV_i) \quad (5)$$

where F is the electrostatic force while C is the capacitance between the vibration body and the electrode. Meanwhile, the first term on the right side represents a bias force based on the bias voltage Vb.

From equation 5, the conversion from an alternating signal voltage into an excitation force increases in efficiency with the increase of |ΔC/Δy| that is a capacitance change per unit displacement amount of the vibration body. Show next is that the FIG. 2 structure using an electrode shape expressed by equation 4 can obtain greater |ΔC/Δy| as compared to the conventional parallel-plate type of electrode structure shown in FIG. 3.

Figure 3:
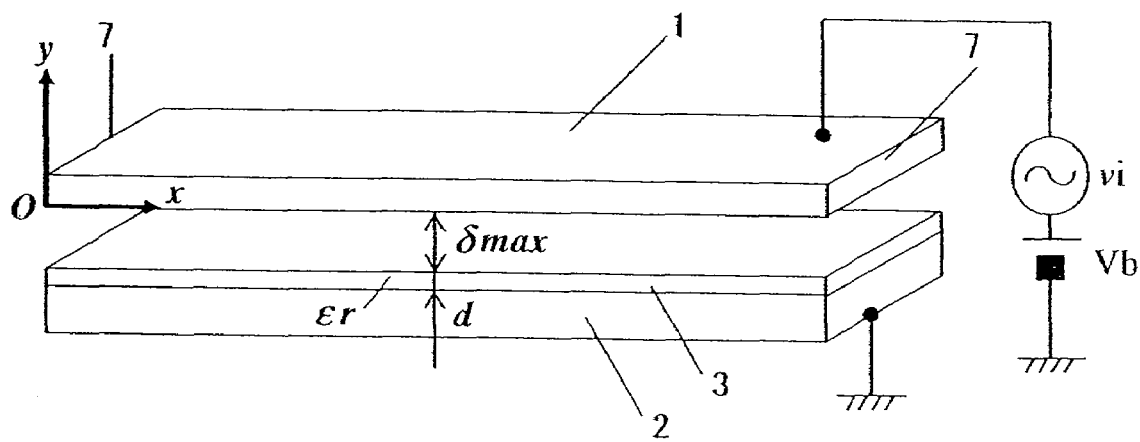
FIG. 3 is a schematic view showing a structure of a conventional mechanical resonator having an electrode made in a parallel plate form.
Figure 4:
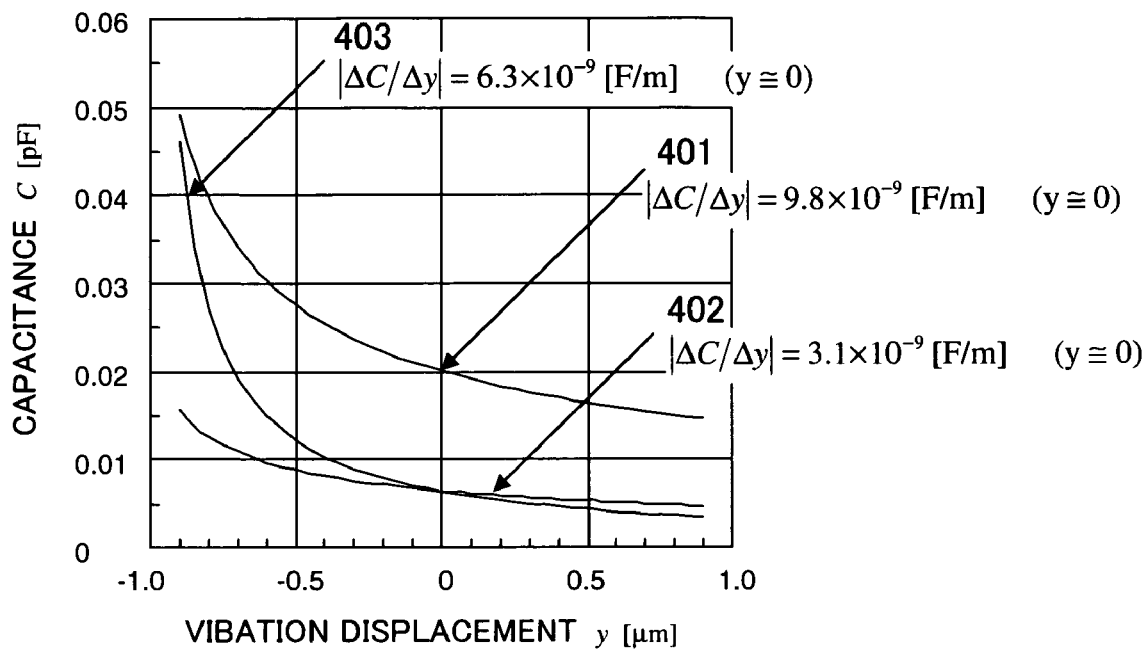
FIG. 4 is a characteristic diagram showing a relationship between a vibration displacement y and a capacitance C (δmax=1 μm) of a resonating vibration body, according to one embodiment of the invention.

In FIG. 4, there is shown a relationship between a displacement amount y at the center of the vibration body and a capacitance C when taking d=0.1 μm, ∈r=1, δmax=1 μm, L=40 μm and W=20 μm in FIG. 2. Incidentally, there is also shown, in FIG. 4, a relationship between y and C on the FIG. 3 structure having the same values of d, ∈r, δmax, L and W. Namely, in FIG. 4, the characteristic curve 401 shows a change on the mechanical resonator having the FIG. 2 structure while the characteristic curve 402 shows a change on the mechanical resonator having the FIG. 3 structure.

At y=0 and the vicinity thereof, |ΔC/Δy|=3.1×10$^{-9}$ [F/m] stays in the FIG. 3 structure whereas improvement is done to |ΔC/Δy|=9.8×10$^{-9}$ [F/m] in the FIG. 2 structure. Namely, at the same alternating current vi, greater resonant vibration is to be obtained by taking the FIG. 2 structure. Incidentally, the value δmax can be set smaller under the assurance that the vibration body is to vibrate at a resonant amplitude, for example, within a range of ±0.1 μm wherein the amplitude greater than that is to be suppressed in a electrical-circuit or mechanical fashion. For example, on the assumption of δmax=0.3 μm, the y and C characteristics are given as in the characteristic curve 501 and characteristic curve 502 shown in FIG. 5, i.e. improvement was obtained up to |ΔC/Δy|=4.7×10$^{-8}$ [F/m] in the FIG. 2 structure.

Note that |ΔC/Δy| stays at a constant value in the region in FIG. 4 where y and C are to be considered in a linear relationship. From equation 5, the relationship of alternating current and excitation force can be handled.

In FIGS. 18A-18D, there is shown a fabrication process for a mechanical resonator according to the present embodiment shown in FIG. 1.

A vibration body and an electrode are formed on a substrate 10. The substrate 10 is, for example, a high-resistance silicon substrate deposited, on its surface, with a silicon oxide film due to thermal oxidation and a silicon nitride film due to low-pressure CVD process.

Figure 18A:
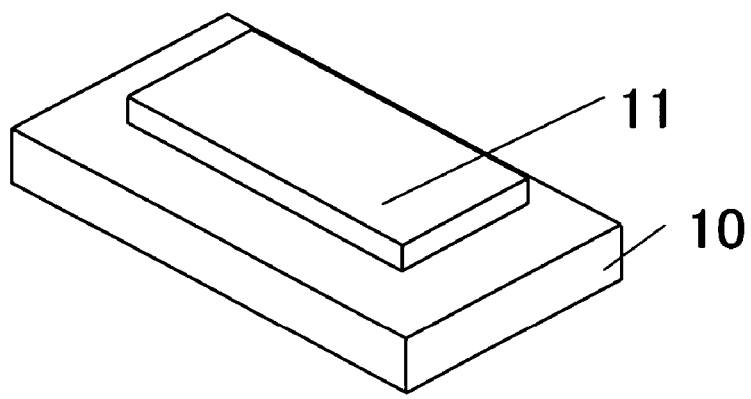
FIGS. 18A-18D are schematic views showing a manufacturing process of a mechanical resonator in one embodiment of the invention.

At first, the substrate 10 is spin-coated with a sacrificial layer of photoresist. After exposure to radiation and development, baking is made over a hot plate, to form a sacrificial layer 11 (FIG. 18A).

Figure 18B:
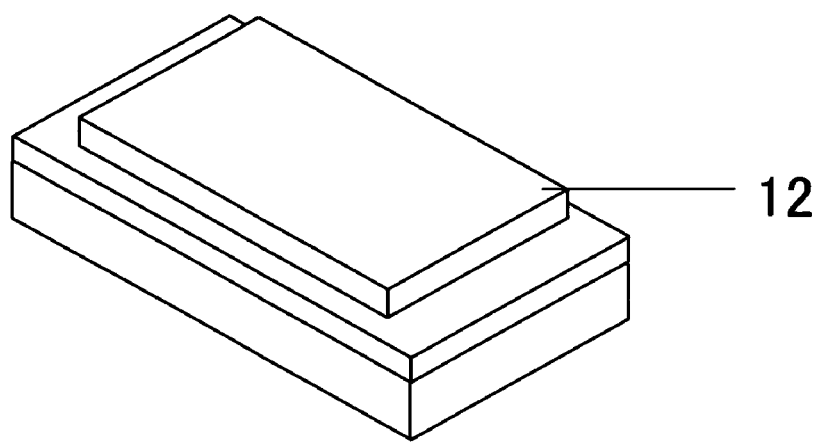

Then, aluminum 12 is deposited by sputtering over the entire substrate surface (FIG. 18B).

Figure 18C:
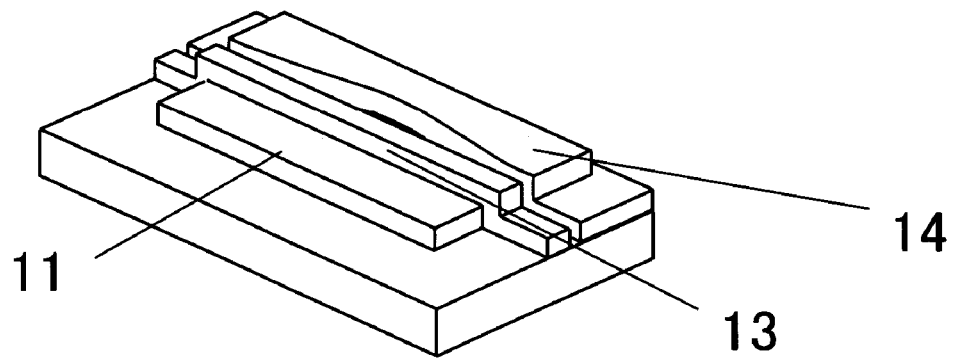

Then, photoresist is formed on the aluminum and patterned by photolithography. Using a pattern of the photoresist as a mask, dry etching is made on the aluminum, thereby forming a vibration body 13 and an electrode 14 (FIG. 18C). At this time, the surface of the electrode 14 facing the vibration body 13 is made in a shape given by a curve expressed by equation 4. This is realized by making the on-mask pattern for use in photolithography into a curve expressed by equation 4.

Figure 18D:
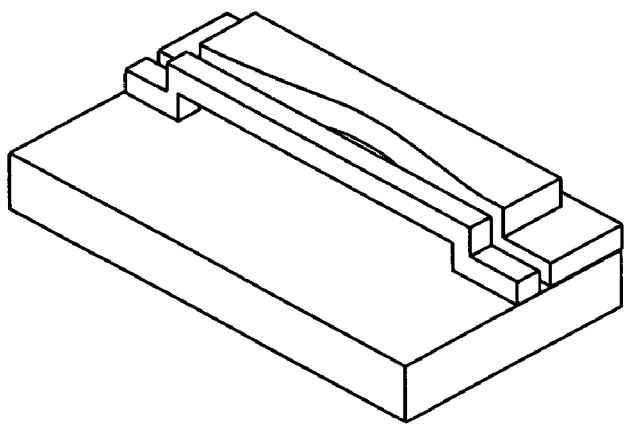

Furthermore, the photoresist pattern and the sacrificial layer 11 are removed away by oxygen plasma. Due to this, the vibration body 13 is made as a both-end-supported beam allowed for vibration, and furthermore a capacitance is formed with the electrode 14 (FIG. 18D). The vibration body 13 can be vibrated by an electrostatic force between the vibration body 13 and the electrode 14. In this case, the vibration of the vibration body 13 is in a direction horizontal to the substrate.

Incidentally, although the embodiment used the high-resistance silicon substrate, the usual silicon substrate, compound semiconductor substrate or insulation-material substrate may be used.

Meanwhile, although the silicon oxide film and the silicon nitride film were formed as insulation films on the high-resistance silicon substrate 10, those insulation films may be omitted to form where the substrate is sufficiently high in resistance.

Meanwhile, although this embodiment used aluminum as a material forming the vibration body and electrode, other metal material may be used such as Mo, Ti, Au or Cu, a semiconductor material introduced with an impurity to a high concentration, e.g. amorphous silicon, or a polymeric material having electrical conductivity. Furthermore, although sputtering was used as a deposition process, CVD process or plating process may be employed in the formation.

Incidentally, the vibration body in this embodiment was the both-end-supported beam. With a cantilever beam, the effect of increasing |ΔC/Δy| is to be similarly obtained by making the electrode in the same surface shape as the mode shape of the cantilever beam.

Explanation is now made on a mechanical resonator in the case the vibration body is by a cantilever beam.

Figure 19:
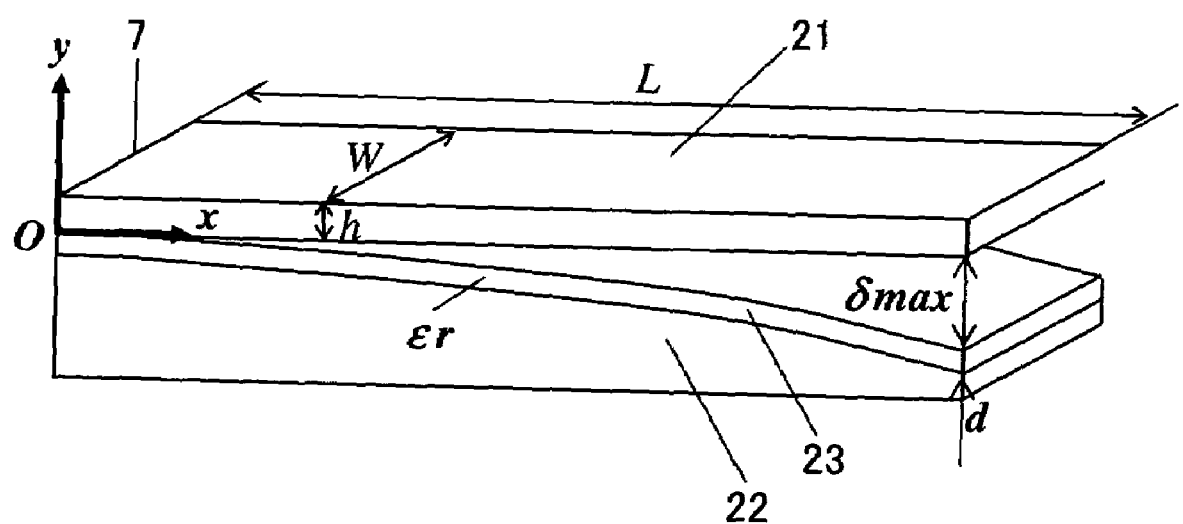
FIG. 19 is a schematic view showing a structure of a mechanical resonator having an electrode surface made in a shape of a flexural vibration primary resonance mode waveform of a cantilever beam, according to one embodiment of the invention.

FIG. 19 is a schematic view of a mechanical resonator where the vibration body is provided as a cantilever beam. A vibration body 21 is a cantilever beam fixed at its one end surface, having a thickness h, a width W and a length L. An electrode 22 is provided in proximity to the vibration body 21, being provided on its surface with an insulation layer 23 having a thickness d. In the case the cantilever beam is vibrated in a primary resonance mode, the surface shape of the electrode 22 is established as in the following equation.

$$y(x) = -\delta\max\left[\frac{1}{2}\{\cosh kx - \cos kx - 0.734096(\sinh kx - \sin kx)\}\right] - d$$

$$k = \frac{1.875104}{L}$$

Incidentally, the vibration mode of the both-end-supported or cantilever beam in the embodiment of the invention was in a flexural vibration primary mode. However, even for the secondary or higher mode, it is possible to obtain an effect that $|\Delta C/\Delta y|$ is to be increased by making the electrode surface shape in a resonance mode waveform of vibration body.

Figure 20A:
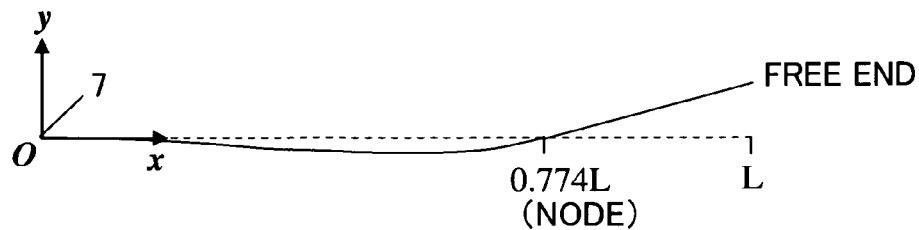
FIG. 20A is a figure showing a flexural vibration secondary resonance mode waveform of a structure of a mechanical resonator cantilever beam.
Figure 20B:
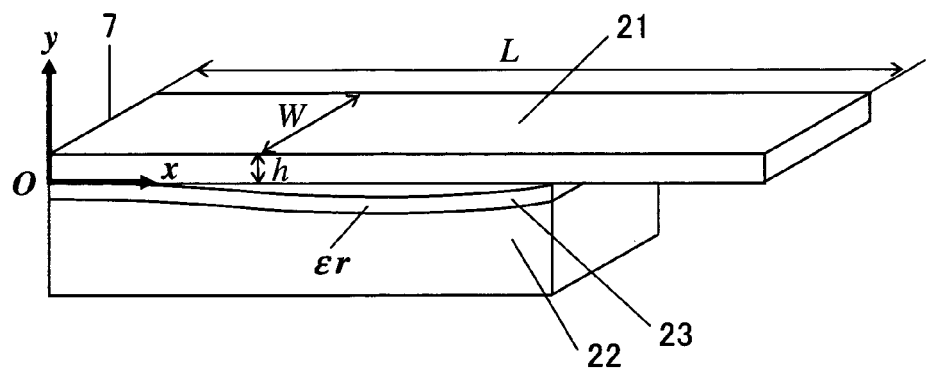
FIG. 20B is a schematic view showing a structure of a mechanical resonator having an electrode surface made in a shape of a flexural vibration secondary resonance mode waveform of a cantilever beam, according to one embodiment of the invention.

The solid curve line depicted on an x-y plane in FIG. 20A represents a flexural vibration secondary mode waveform of cantilever beam. Namely, the cantilever beam having a length L has one node at a point distant 0.774 L from the fixed end. At this time, in case the electrode surface is made in a form of a resonant-mode waveform over the entire of the length L, the beam is prevented by the electrode from resonating in a region from the node to the free end. Accordingly, the electrode is restricted in a length from the fixed end to the node, as shown in FIG. 20B.

Figure 20C:
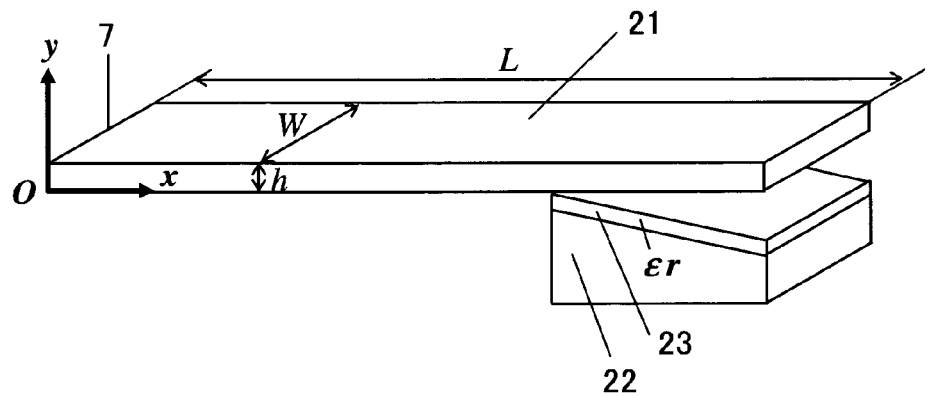
FIG. 20C is a schematic view showing another structure of a mechanical resonator having an electrode surface made in a shape of a flexural vibration secondary resonance mode waveform of a cantilever beam, according to one embodiment of the invention.
Figure 20D:
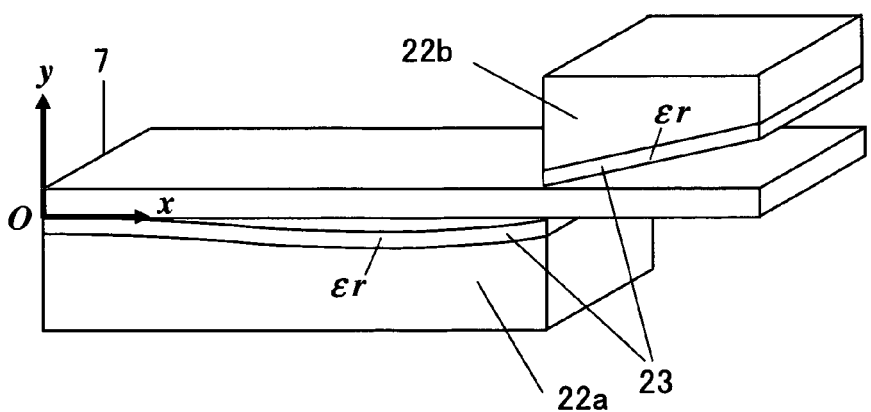
FIG. 20D is a schematic view showing a structure of a mechanical resonator that FIGS. 20B and 20C are combined together, according to one embodiment of the invention.

Besides, similar effect is to be obtained where the electrode is arranged in a lengthwise position from the node to the free end, as shown in FIG. 20C. Otherwise, the electrodes 22 in FIGS. 20B and 20C can be respectively arranged sandwiching the vibration body, e.g. the electrode 22a can be used for exciting the vibration body 21 while the electrode 22b can be used for detecting a vibration of the vibration body 21.

As described above, according to this embodiment, the capacitance change per unit displacement amount of the vibration body for resonant vibration is maximized by making the electrode surface shape resemble a shape at resonance mode of the vibration body. Therefore, it is possible to efficiently convert an electric signal into a mechanical vibration, and to efficiently convert a mechanical vibration into an electric signal. Incidentally, it is not required to perfectly coincide the electrode surface shape with the shape of the vibration body in a resonance mode. Instead, the effect can be obtained higher as that form is approximated.

Meanwhile, a miniaturized mechanical-vibration filter excellent in conversion efficiency can be realized by attaching electrodes respectively for vibration and for detection, as noted above.

Embodiment 2

Figure 6:
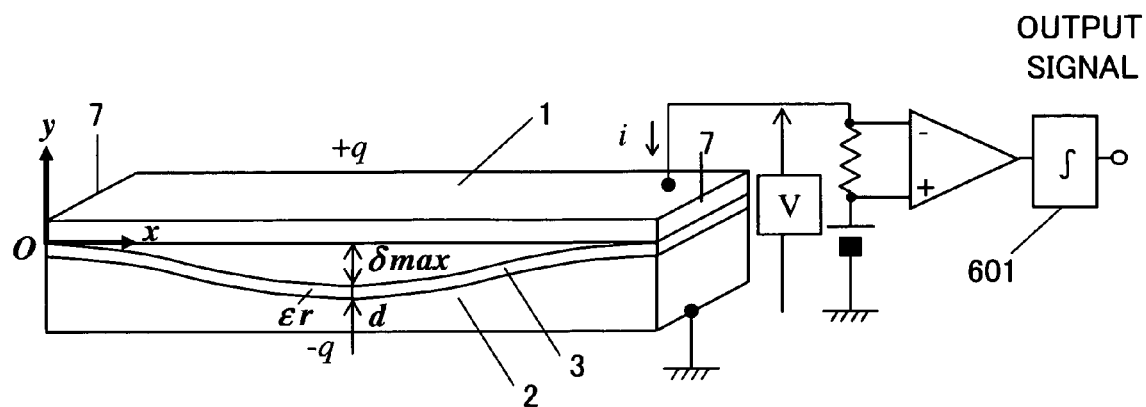
FIG. 6 is a schematic view showing a structure of a machine-to-electricity converter, according to one embodiment of the invention.

FIG. 6 is an example that the mechanical resonator of the FIG. 1 structure is employed in a machine-to-electricity converter.

In FIG. 6, the displacement of a vibration body 1 flexurally vibrating in a y-axis direction is detected as a capacitance C change with the electrode 2. A flowing current i is expressed by the following equation, i.e. expressed by a product of a vibration rate and $\Delta C/\Delta y$.

$$i = \frac{dq}{dt} \cong \frac{dC}{dy}\frac{dy}{dt}V \quad (6)$$

In case using a displacement region where $\Delta C/\Delta y$ can be regarded as nearly a constant value, a beam displacement signal can be reproduced by passing a current signal through an integrator 601. At this time, the greater current signal is obtained as $\Delta C/\Delta y$ is greater. Provided that $d=0.1$ μm, $\epsilon r=1$, $\delta\max=1$ μm, $L=40$ μm and $W=20$ μm similarly to FIG. 2 as already shown in FIG. 4, is obtained $|\Delta C/\Delta y|$ greater by adopting the structure of the invention rather than the conventional parallel-plate structure in FIG. 3. Due to this, the machine-to-electricity converter in the embodiment can efficiently convert a weak vibration into an electric signal.

Embodiment 3

Figure 7:
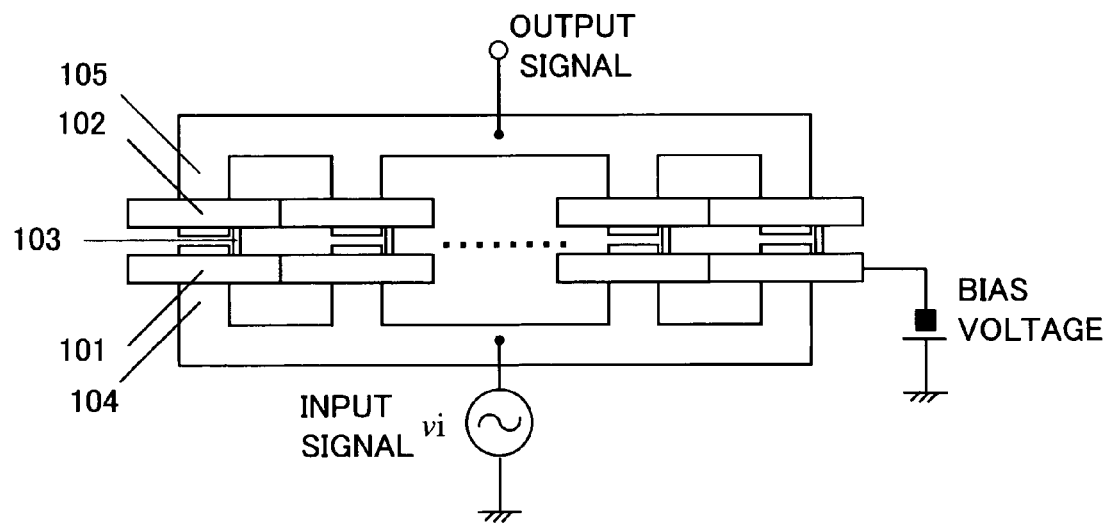
FIG. 7 is a schematic view showing a structure of mechanical resonant filters arranged in parallel, according to one embodiment of the invention.

FIG. 7 is a structural view of a mechanical vibration filter using a mechanical resonator according to the present embodiment.

Figure 22:
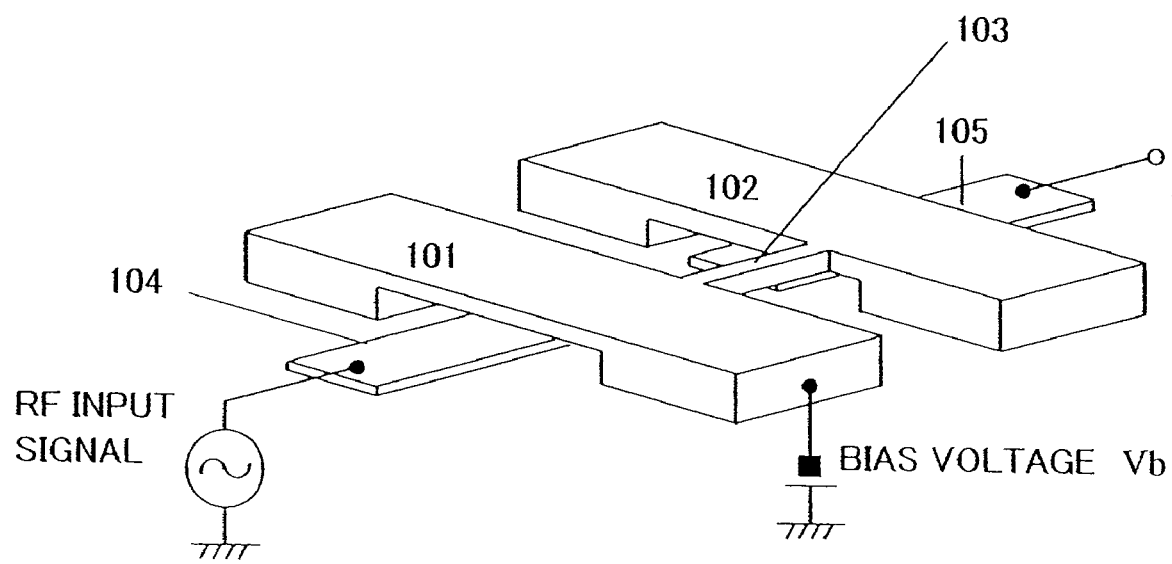
FIG. 22 is a schematic view showing a filter using the conventional mechanical resonator.
Figure 23:
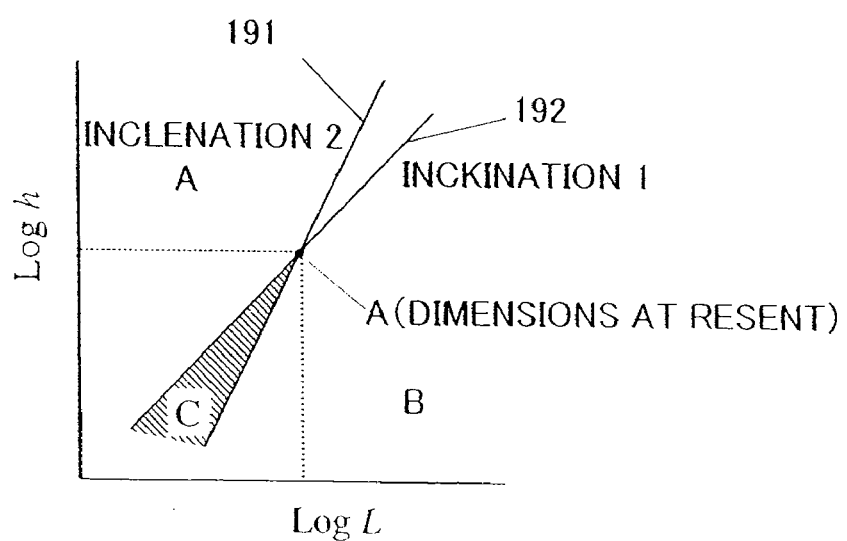
FIG. 23 is a characteristic diagram showing a relationship between dimensions and frequency increase of the conventional mechanical resonator.

In FIG. 7, the mechanical vibration filter has a capacitance coupling of input line 104 and both-end-supported beam 101 serving as an electricity-to-machine converter, and a capacitance coupling of output line 105 and both-end-supported beam 102 serving as a machine-to-electricity converter, both of which are shown in FIG. 22 and to both of which is applied the electrode having a shape in a resonance mode shown as embodiment 1 and 2 of the invention in FIG. 1. Furthermore, the mechanical vibration filter is structured by parallel arranging a plurality of filters each including a set of electricity-to-machine converter and machine-to-electricity converter, to input an input voltage by branching to the filters and extract collectively the output current signals of the filters. By thus properly adjusting the number of filters, it is possible to decrease the reflection signal due to impedance mismatch that is problematic particularly on a high-frequency circuit, and hence to efficiently convert an electric signal into a mechanical vibration and extract again the mechanical vibration as an electric signal.

Now an example is shown that a plurality of filters are arranged in series.

Figure 8:
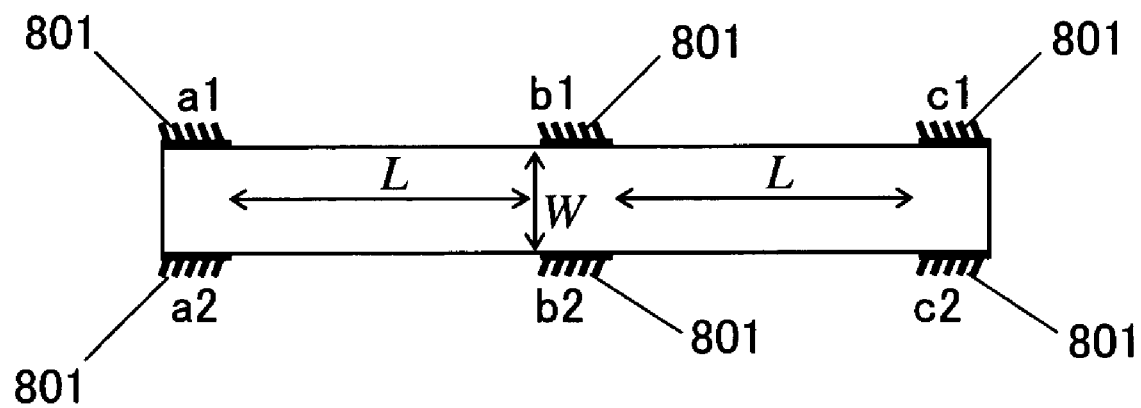
FIG. 8 is a top view of a structure of a 6-point-fixed type beam, according to one embodiment of the invention.

FIG. 8 is a top view of a beam structure, in which the six points at beam side surfaces a1, a2, b1, b2, c1 and c2 are fixed as fixed faces. This structure provides nearly equivalently a series structure of two both-end-supported beams having a length L and a width W. This is because of the conveyance of a vibration on one both-end-supported beam to the other both-end-supported beam between the fixed faces b1, b2. The spacing between the fixed faces b1, b2 serves as a joint beam.

Figure 9:
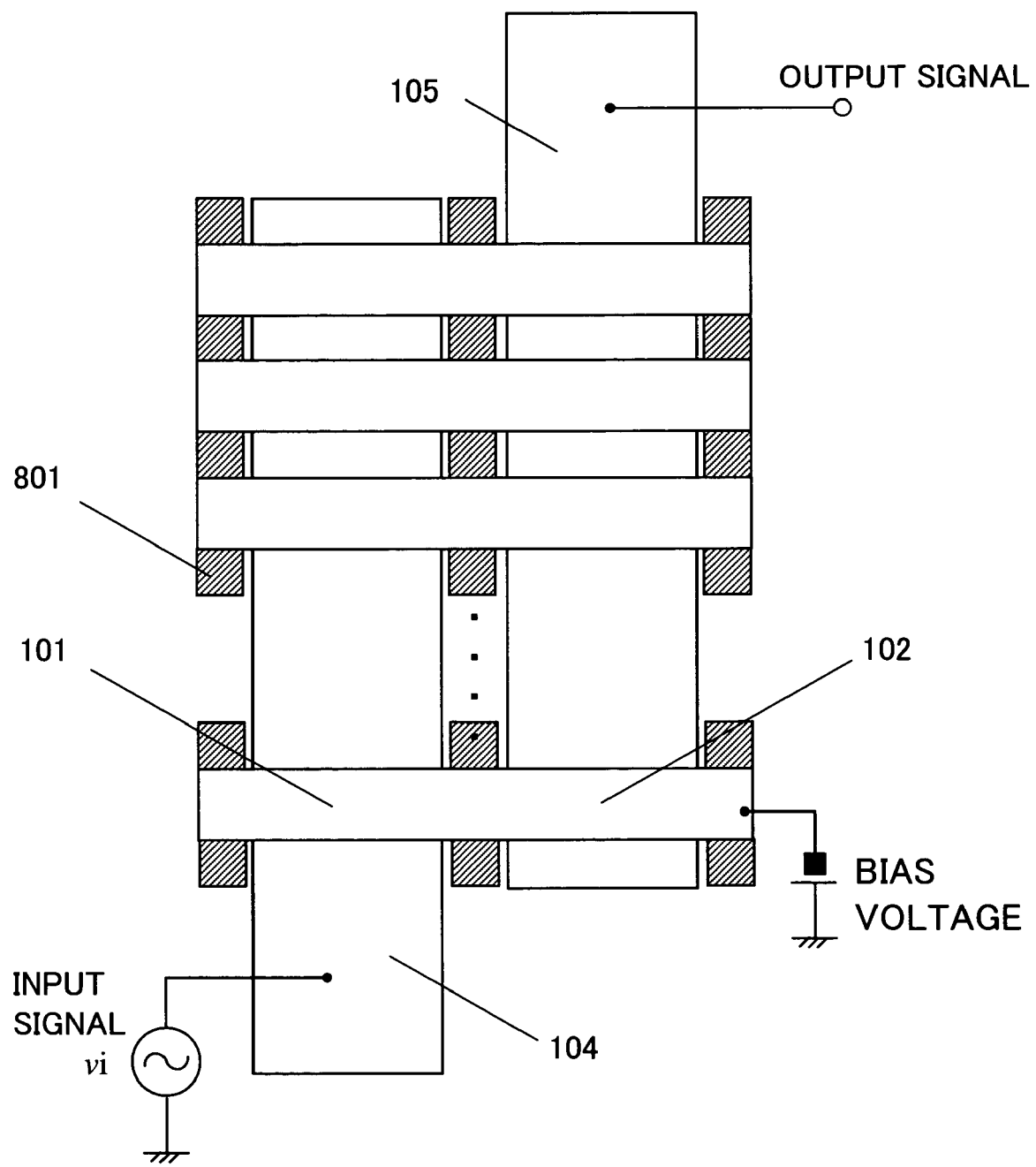
FIG. 9 is a schematic view showing a structure of mechanical resonant filters arranged in series using the FIG. 8 beam structure, according to one embodiment of the invention.

FIG. 9 is a structural view of a mechanical vibration filter using mechanical resonators of the above beam structure.

In FIG. 9, capacitance coupling is provided between one both-end-supported beam 101 of the beam structure shown in FIG. 8 and an input line 104 having an electrode structure of the invention shown in FIG. 1, while capacitance coupling is provided between another both-end-supported beam 102 and an output line 105 having an electrode structure shown in FIG. 1. Furthermore, the mechanical vibration filter of this beam structure is in a structure having an arrangement of a plurality of filters in series. In this manner, the beam structure in FIG. 8 easily enables an impedance matching due to series connection. Furthermore, because of no need to provide such an extremely thin structural member less resistive to impacts as joint beam 103 in the FIG. 22, strength is raised and manufacture yield is improved.

Embodiment 4

Figure 10:
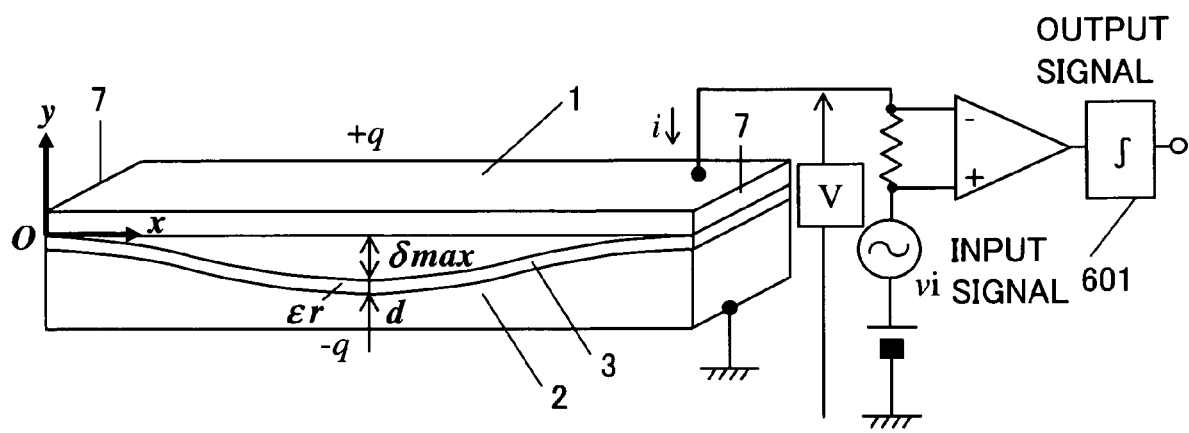
FIG. 10 is a schematic view showing a structure of mechanical resonant filters having a simple electricity-to-machine-to-electricity converting function, according to one embodiment of the invention.

FIG. 10 is a mechanical vibration filter having a mechanical resonator structure realizing the both functions by one vibration body, differently from the FIG. 22 filter structure having separately an electricity-to-machine converter and an machine-to-electricity converter. Specifically, this embodiment has a structure common to both the electricity-to-machine converter shown in FIG. 2 as to embodiment 1 and the machine-to-electricity converter shown in FIG. 6 as to embodiment 2. This structure is featured simple in construction. However, there encounters an unwanted alternating current leaking through a steady capacitance of a capacitor besides an alternating current occurring resulting from a capacitance change due to a displacement of the vibration body 1 vibrated upon an input signal vi. Namely, in the case of taking an alternating-current operation point at y=0 in FIG. 4, when the capacitance at y=0 is great, there occurs a flow of an unwanted alternating current not resulting from vibration, thus resulting in lowered filter function. Accordingly, $|\Delta C/\Delta y|$ is desirably great as was described in embodiments 1 and 2. However, there is a need to decrease the value C to a possible extent.

Figure 11A:
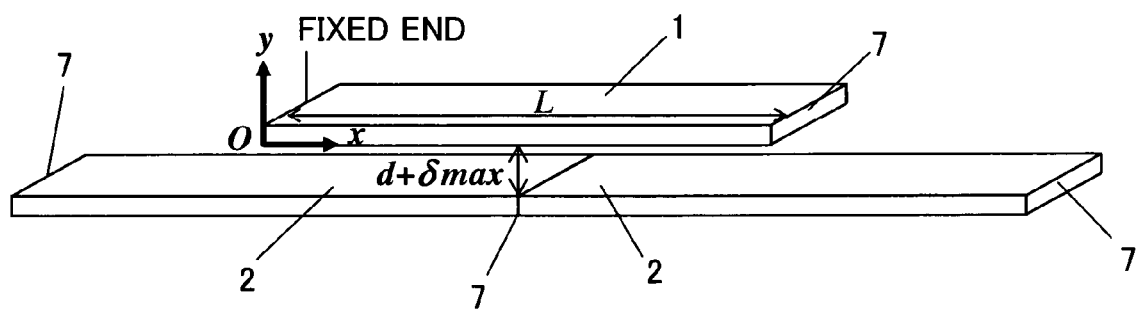
FIGS. 11A and 11B are schematic views showing a structure of a mechanical resonator that the electrode also has a resonant structure, according to one embodiment of the invention.

For this reason, in this embodiment, the mechanical resonator has an electrode 2, opposed to the vibration body 1, made also in a structural member allowed to vibrate in a resonance mode at the same resonant frequency as the vibration body 1 as shown in FIG. 11A wherein it is arranged deviated in relative position by a half wavelength of a mode standing wave. Here, the electrode 2 is deviated by a half of the beam length in an x-direction because of utilization of a primary resonance mode.

Figure 11B:

This mechanical resonator is a mechanical vibration filter made in the parallel structure shown in embodiment 3, which is shown in a part of the x-directional-repetition structure in FIG. 11A. Meanwhile, there is shown in FIG. 11B the vibration body 1 and electrode 2 in a vibration state. Here, the relationship between a vibration displacement y and a capacitor's capacitance C per length L is shown at a characteristic curve 403 in FIG. 4. In the state of FIG. 11A, i.e. at a vibration displacement y=0, the capacitance C is allowed to take a small value nearly in the same degree as that of the parallel-plate structure of FIG. 3. Meanwhile, in FIG. 11B showing a resonant state, the capacitance approximates a capacitance between conductors in quite proximity, i.e. the capacitance in the structure of FIGS. 2 and 6 described in embodiments 1 and 2. As a result, $|\Delta C/\Delta y|=6.3\times10^{-9}$ [F/m] results at y=0, which is greater than the value of the conventional parallel-plate structure shown in FIG. 3 and approximate to the value of FIGS. 2 and 6 structure. Therefore, the FIG. 11 structure if applied to the FIG. 10 mechanical vibration filter reduces unwanted alternating currents and structures an efficient filter having a great $|\Delta C/\Delta y|$ value.

Figure 5:
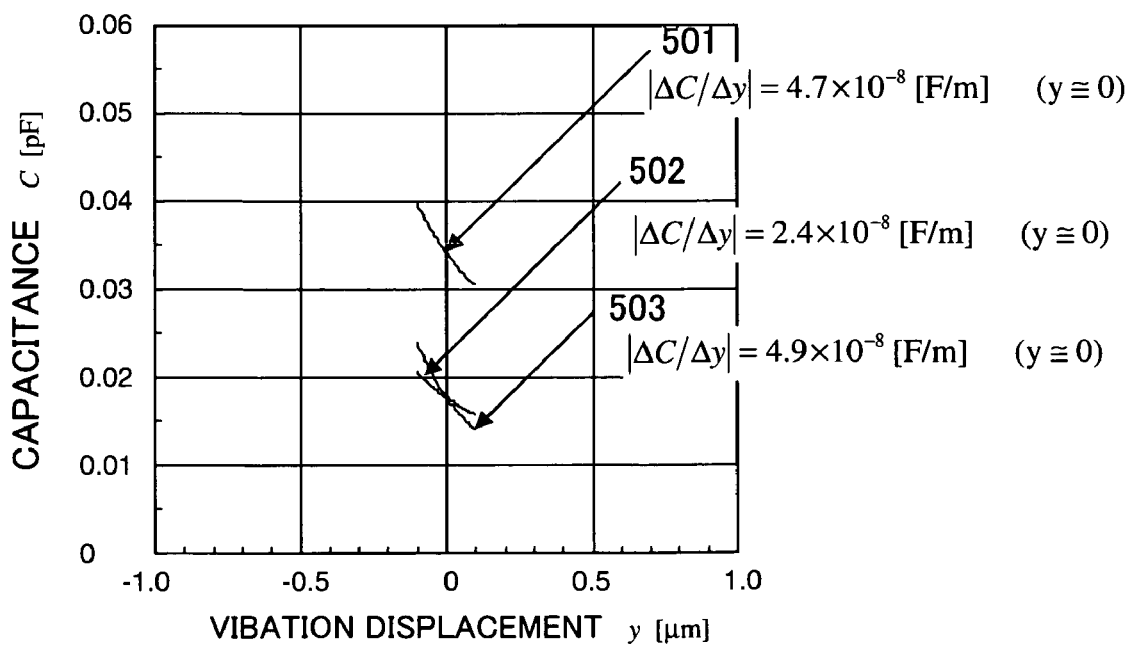
FIG. 5 is a characteristic diagram showing a relationship between a vibration displacement y and a capacitance C (δmax=0.3 μm) of a resonating vibration body, according to one embodiment of the invention.

A characteristic curve 503 in FIG. 5 is a y-C characteristic in the case of taking bmax=0.3 μm. FIG. 5 indicates that the mechanical resonator having a FIG. 11 structure, at y=0, has a capacitance C as small as the that of the conventional parallel-plate structure shown in FIG. 3 wherein $|\Delta C/\Delta y|$, on the other hand, can be increased nearly equal to that of the structure of FIGS. 2 and 6.

Due to those, the mechanical resonator of this embodiment with simple structure is allowed to have a decreased capacitance at a smaller displacement of the vibration body and an increased capacitance at a greater displacement of the vibration body in the resonance mode. This accordingly reduces the unwanted alternating current and makes it possible to efficiently convert an electric signal into a mechanical vibration and a mechanical vibration into an electric signal. Meanwhile, by attaching an electrode for vibration and for detection on a both-end-supported beam, the mechanical vibration filter using the mechanical resonator realizes a miniaturized mechanical vibration filter.

FIGS. 21A to 21D are views showing a fabrication process for a mechanical resonator according to the embodiment shown in FIG. 11.

In FIG. 21A to 21D, the vibration body is formed on a substrate 10. For example, the substrate 10 is, for example, a high-resistance silicon substrate deposited, on its surface, with a silicon oxide film due to thermal oxidation and a silicon nitride film due to low-pressure CVD process.

Figure 21A:
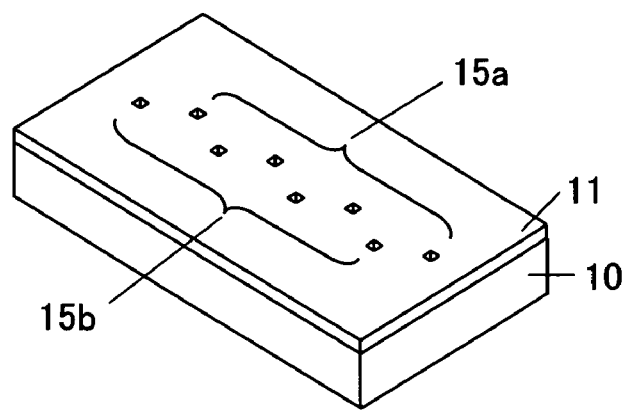
FIGS. 21A-21D are schematic views showing a manufacturing process of a mechanical resonator that the electrode also has a resonant structure, in one embodiment of the invention.

At first, the substrate 10 is spin-coated with a layer of photoresist. After exposure to radiation and development, baking is performed over a hot plate, thus forming a sacrificial layer 11 (FIG. 21A). At this time, fine holes 15a and 15b are formed arranged at a constant pitch in the sacrificial layer 11. The fine holes 15a, 15b are formed in positions deviated a half pitch from each other, as shown in the figure.

Figure 21B:
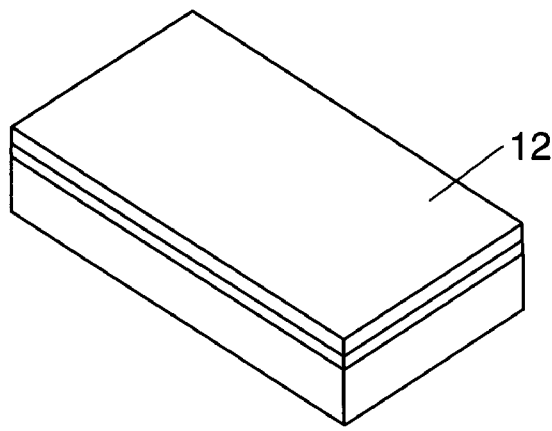

Then, aluminum 12 is deposited by sputtering over the entire substrate surface (FIG. 21B). At this time, aluminum is buried also in the fine holes 15.

Figure 21C:
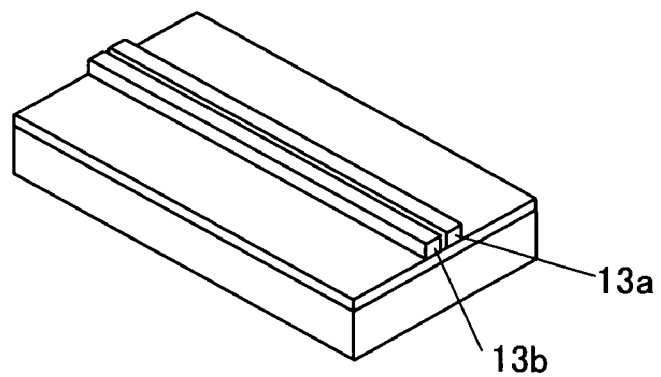
Figure 21D:
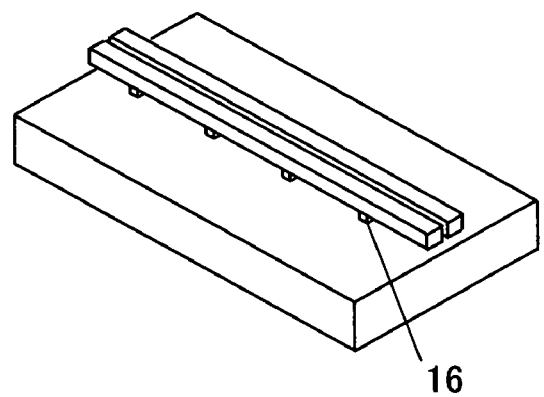

Then, photoresist is formed on the aluminum and patterned by photolithography. Using a pattern of the photoresist as a mask, dry etching is made on the aluminum, thereby forming a vibration body 13a and a vibration body 13b (FIG. 21C). At this time, the vibration body 13a is formed over the fine holes 15a while the vibration body 13b is over the fine holes 15b.

Furthermore, the photoresist pattern and sacrificial layer 11 is removed away by oxygen plasma. This makes the vibration body 13 into a beam allowed for vibrating. Meanwhile, because the vibration body 13 is fixed on the substrate 10 by anchors 16 of alminum buried in the fine holes 15, there are continuously formed both-end-supported beams having the anchors 16 as fixed ends. This can realize the FIG. 11 mechanical resonator structure. However, in this case, the vibration of the vibration body 13 is in a direction horizontal to the substrate.

Incidentally, although this embodiment used the high-resistance silicon substrate, the usual silicon substrate, compound semiconductor substrate or insulation-material substrate may be used.

Meanwhile, although the silicon oxide film and the silicon nitride film were formed as insulation films on the high-resistance silicon substrate 10, those insulation films may be omitted to form where the substrate is sufficiently high in resistance.

Meanwhile, although this embodiment used aluminum as a material forming the beam, other metal material may be used such as Mo, Ti, Au or Cu, a semiconductor material introduced with an impurity to a high concentration, e.g. amorphous silicon, or a polymeric material having electrical conductivity. Furthermore, although sputtering was used as a deposition process, CVD process or plating process may be employed in formation.

Embodiment 5

Figure 12:
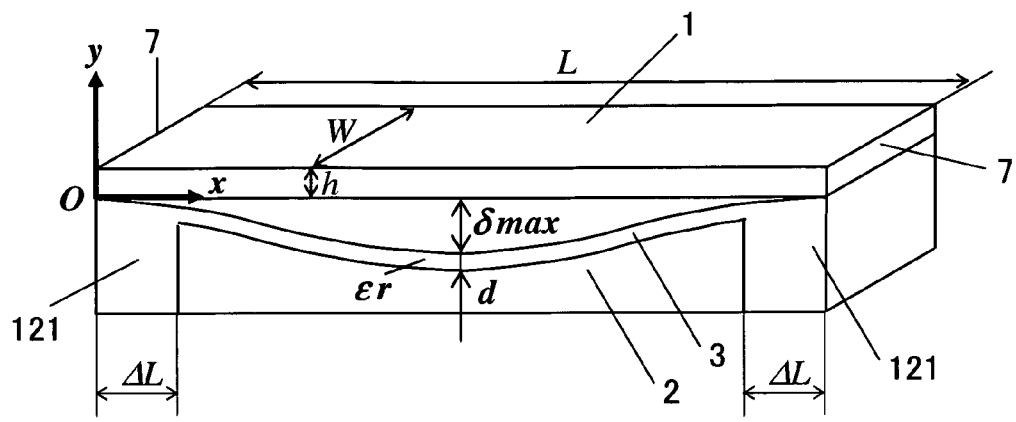
FIG. 12 is a schematic view showing a structure of a mechanical resonator made insulative at both ends of the electrode, according to one embodiment of the invention.

This embodiment concerns a method of reducing the capacitance of a capacitor on a mechanical resonator in order to suppress an alternating current occurring unwontedly, for the same purpose as embodiment 4. FIG. 12 is a structural view of a mechanical resonator according to the present embodiment.

In FIG. 12, the difference from the FIG. 1 structure lies in that the conductor 121 in a length from each end of the electrode 2 replaces the insulator.

Figure 13:
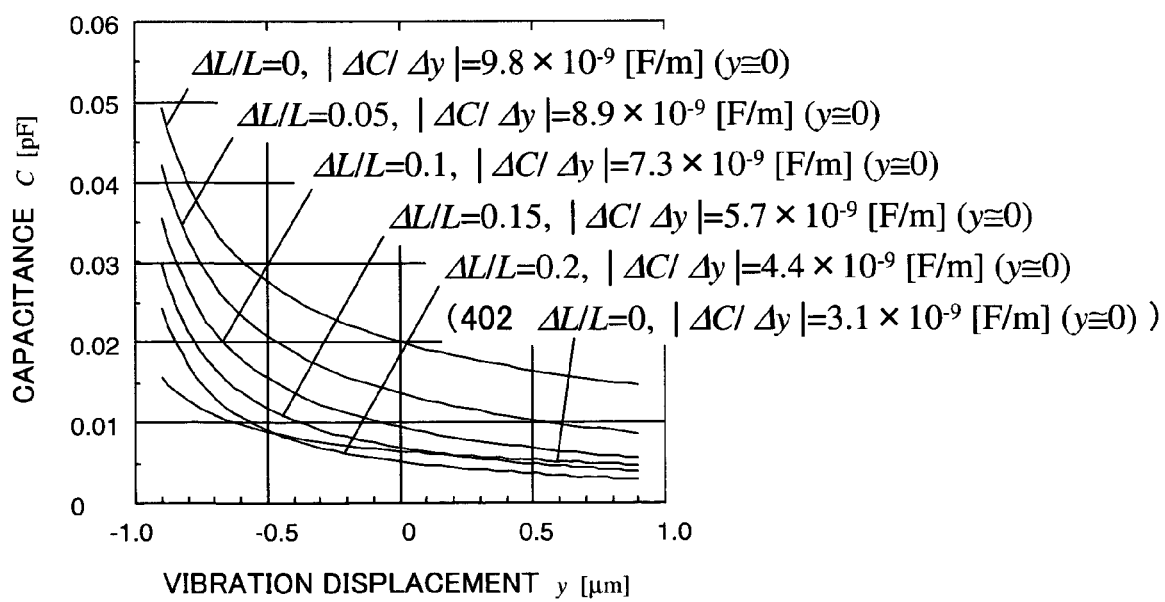
FIG. 13 is a characteristic diagram showing a relationship between a vibration displacement y and a capacitance C on a FIG. 12 structure, according to one embodiment of the invention.

FIG. 13 is a characteristic figure representing a relationship of a vibration displacement y and a capacitance C where $\Delta L/L$ is taken as a parameter. Note that d=0.1 μm, $\epsilon r$=1, $\delta$max=1 μm, L=40 μm and W=20 μm.

The capacitance C can be decreased with increasing the insulation regions of the electrode at both ends, i.e. increasing $\Delta L/L$. However, at this time, $|\Delta C/\Delta y|$ also decreases approximating the |ΔC/Δy| value of the conventional parallel-plate structure shown in FIG. 3 as a reference in the figure. The decreasing capacity C and the increasing |ΔC/Δy| are in a trade-off relationship wherein the optimal y-C characteristic can be selected to meet a use condition.

Putting in other words the effect obtained by replacing the both ends of the electrode with the insulator as in the above, there is not always a need to arrange over the entire length L an electrode having a surface in a shape of a waveform in a resonance mode, in order to increase |ΔC/Δy| greater than that of the conventional parallel-plate structure. It can be considered that effects are obtainable similarly with a waveform at resonance mode in a part of the entire length.

Due to those, the mechanical resonator of this embodiment in simple structure, is allowed to have a decreased capacitance at a smaller displacement of the vibration body and an increased capacitance at a greater displacement of the vibration body in the resonance mode. This accordingly reduces the unwanted alternating current and makes it possible to efficiently convert an electric signal into a mechanical vibration and a mechanical vibration into an electric signal.

Embodiment 6

This embodiment concerns a method of improving the non-linearity as to the relationship between a vibration displacement y and a capacitance C of the vibration body. Namely, looking the relationship of y and C shown in FIG. 4, the use of an electrode, in the form of a waveform in a resonance mode of FIGS. 2 and 6, has improved |ΔC/Δy| as an index of machine/electricity conversion in comparison with the conventional parallel-plate structure in FIG. 3. However, there encounters a minus displacement of the vibration body, i.e. conspicuous non-linearity when the vibration body comes near the electrode. Accordingly, this makes it difficult to consider ΔC/Δy a constant in equation 5 and equation 6. Thus, the relationships between a voltage and a force, and between a displacement and a current take a complicated behavior.

Figure 14:
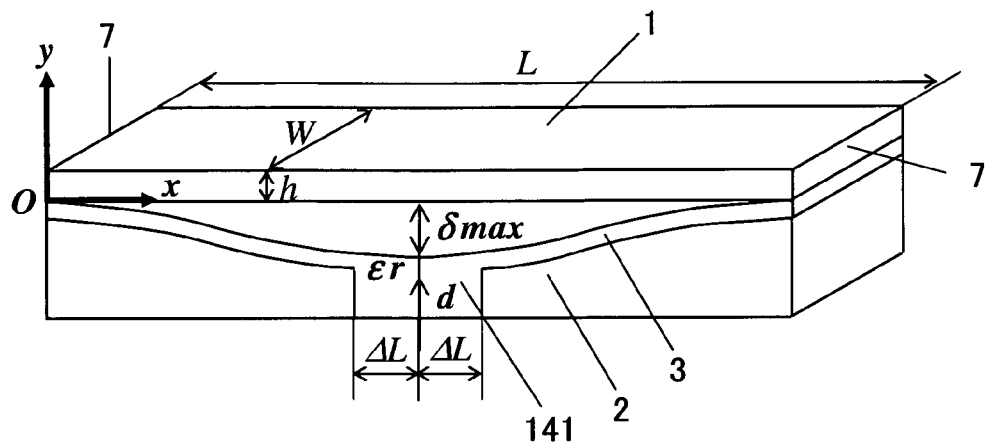
FIG. 14 is a schematic view showing a structure of a mechanical resonator made insulative at the center of the electrode, according to one embodiment of the invention.

FIG. 14 is a structural view of a mechanical resonator according to the present embodiment. In FIG. 14, there is a difference from the structure in FIG. 1 in that the insulator is replaced with the conductor in a length amount of ΔL taken on the x-directional both sides from the center of the electrode 2.

Figure 15:
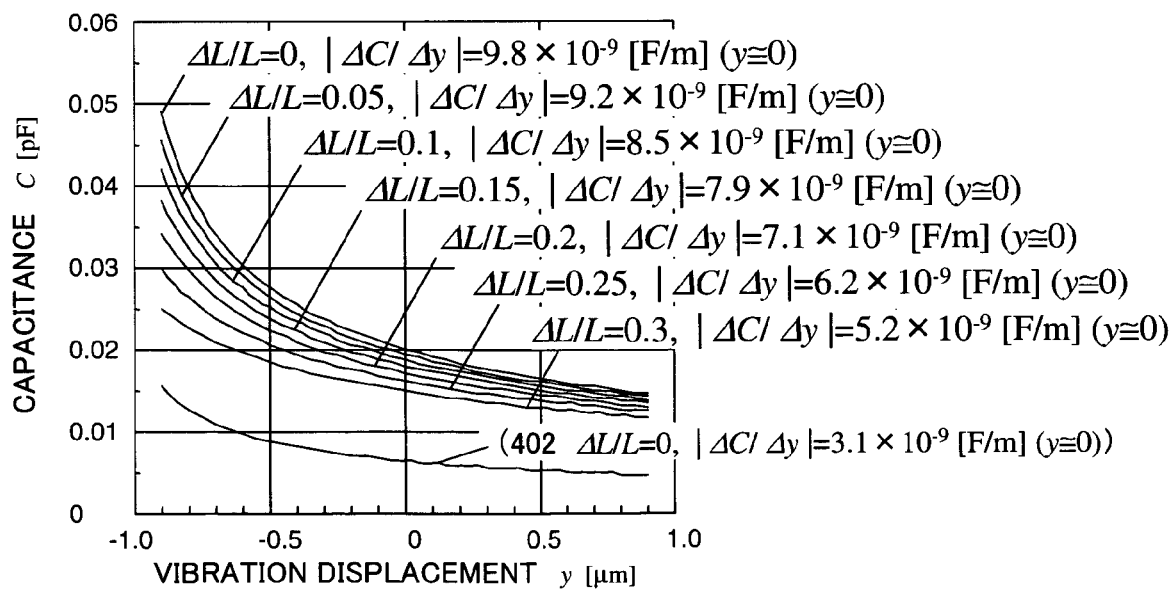
FIG. 15 is a characteristic diagram showing a relationship between a vibration displacement y and a capacitance C on a FIG. 14 structure, according to one embodiment of the invention.

FIG. 15 is a characteristic figure representing the relationship between a vibration displacement y and a capacitance C where ΔL/L is taken as a parameter, where d=0.1 μm, εr=1, δmax=1 μm, l=40 μm and W=20 μm.

The linearity when the vibration body 1 comes near the electrode 2 can be suppressed as the ΔL insulation region 141 is increased with respect to the electrode center, i.e. ΔL/L increases. Note that, because of decreased |ΔC/Δy| at this time, it is possible to obtain the optimal y-C characteristic meeting a use condition, at the trade-off of the both.

Putting in other words the effect obtained by replacing the center region of the electrode with the insulator as in the above, there is not always a need to arrange over the entire length L an electrode having a surface in the form of a waveform in a resonance mode, in order to increase |ΔC/Δy| greater than that of the conventional parallel-plate structure. It can be considered that effects are obtainable similarly with a waveform in a resonance mode in a part of the entire length.

Due to those, the mechanical resonator of this embodiment in simple structure, is allowed to have a decreased capacitance at a smaller displacement of the vibration body and an increased capacitance at a greater displacement of the vibration body in the resonance mode. This accordingly reduces the unwanted alternating current and makes it possible to efficiently convert an electric signal into a mechanical vibration and a mechanical vibration into an electric signal. Furthermore, the mechanical resonator in this embodiment has relationships between voltage and force and between displacement and current approximated to linearity and hence can be made easy to control.

Embodiment 7

This embodiment concerns a switch structure that makes use of the fact that a great amplitude of a vibration body can be obtained even at a low input voltage by providing the electrode surface shape with a waveform in a resonance mode.

Figure 16:
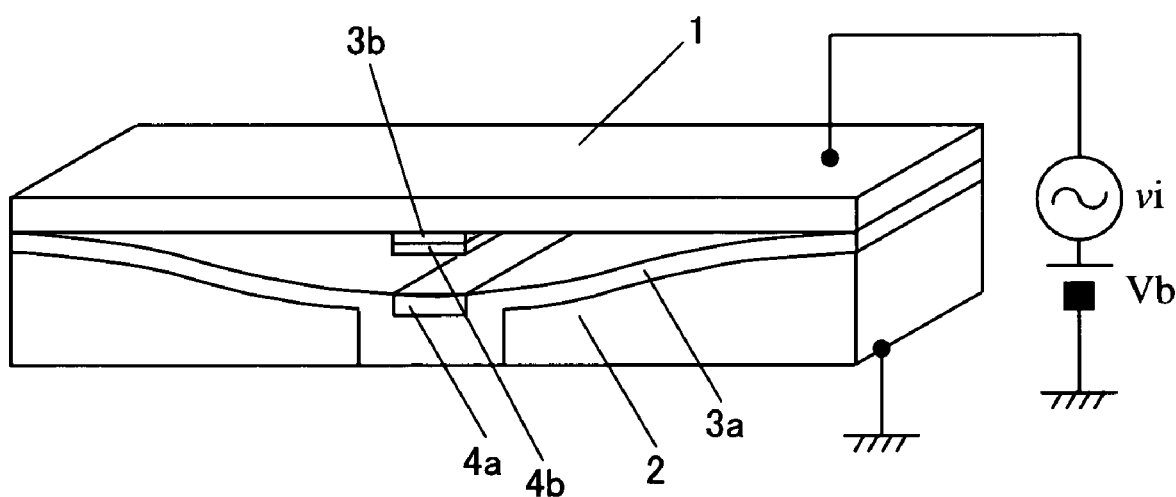
FIG. 16 is a schematic view showing a structure of a mechanical resonator having a switch structure, according to one embodiment of the invention.

FIG. 16 is a structural view of a switch according to the present embodiment.

In FIG. 16, a contact 4a is formed as a first contact electrode in an insulation layer 3a in the vicinity of a center of an electrode 2, whose surface is exposed on the insulation layer 3a. Also, a contact 4b is formed as a second contact electrode through an insulation port 3b at a lower surface center of a vibration body 1, to apply a direct-current bias voltage Vb and alternating voltage vi to between the vibration body 1 and the electrode 2. An insulation port 3b is provided between the vibraton body 1 and the contact 4b so as to isolate the contact 4b from the vibration body 1. The difference from the structure of the mechanical resonator in embodiment 6 lies in having those contact 4a, 4b which are arranged to be isolated from the electrode 2 and the vibration body 1, respectivly.

In the usual switch, an electrostatic force is applied to the vibration body 1 by applying only a direct-current voltage Vb without using an alternating-current voltage vi. When Vb exceeds a pull-in voltage, then the electrostatic force surpasses the spring restitution force of the vibration body 1 and the vibration body 1 is suddenly attracted toward the electrode, thus closing the contacts 4a, 4b. However, a high-voltage generation circuit is required because of high pull-in voltage usually attaining several tens to several hundreds volts.

Contrary to this, the switch in this embodiment causes the vibration body 1 to vibrate on an alternating current vi at the same frequency as the resonant frequency of the vibration body 1. Because the amount of vibration displacement of the vibration body at this time is as great as Q-value times that in the case applied with an equivalent static electrostatic force, the vibration body 1 easily reaches a vicinity of the insulation layer 3a. Thereafter, the vibration body 1 is electrostatically absorbed to the electrode 2 by a bias voltage Vb. Incidentally, in the present embodiment, the damping effect upon the vibration body by air viscosity is excluded to a possible extent by accommodation within a case to seal the atmosphere at vacuum.

As described above, by providing the structure according to the invention, conversion efficiency is improved from an electric signal into a mechanical signal. Because high resonant vibration is obtainable, it is possible to realize a switch mechanism that the vibration body in a resonant state is to be contacted with the electrode and held by an electrostatic force.

Embodiment 8

Figure 17:
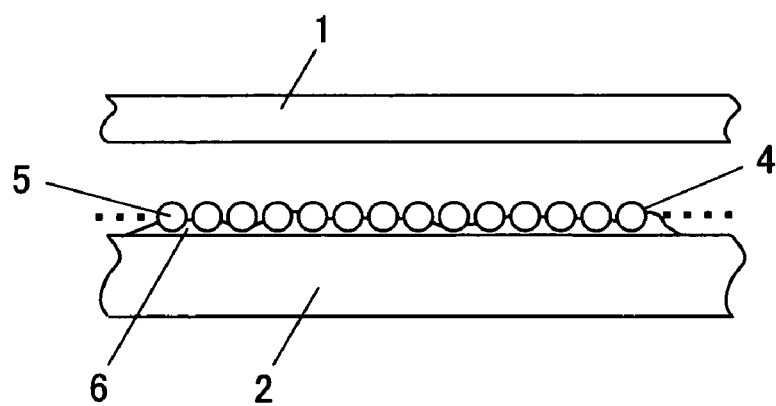
FIG. 17 is a schematic view showing an insulation layer using a 4-fluoroethylene resin particle, according to one embodiment of the invention.

FIG. 17 is a detailed view of an insulation layer 3 on an electrode 2 of a switch according to the invention, showing a state that a fluororesin particle 5 having a particle size of 1 μm is formed in a single layer, together with an electroless plating layer 6, over the electrode. By thus forming a resin particle

The invention claimed is:

1. A mechanical resonator comprising:
   a vibration body operable to perform mechanical resonant vibration;
   first fixed ends provided to the vibration body at a constant pitch;
   an electrode located in a vicinity of the vibration body and operable to vibrate in a resonance mode at a same resonant frequency as the vibration body; and
   second fixed ends provided to the electrode at the constant pitch in the same direction with the first fixed ends,
   wherein the second fixed ends of the electrode are arranged deviated relative to the first fixed ends of the vibration body by half of the constant pitch.

2. A mechanical resonator according to claim 1, wherein an insulation layer is provided between at least a portion of the electrode and the vibration body.

3. A mechanical resonator according to claim 1, further including a bias power source connected to the vibration body and the electrode and operable to generate an electrostatic field between the vibration body and the electrode;
   the vibration body being operable to resonantly vibrate when a voltage change at resonant frequency is provided between the vibration body and the electrode.

4. A mechanical resonator according to claim 1, further including a detection section operable to detect a signal from a voltage change between the electrode and the vibration body;
   wherein the detecting section is operable to detect a signal converted from a vibration body into an electric signal due to an electrostatic capacitance change between the vibration body and the electrode during vibration of the vibration body.

5. A mechanical resonator comprising:
   a vibration body operable to perform mechanical resonant vibration;
   an electrode located in a vicinity of the vibration body and operable to vibrate in a resonance mode at a same resonant frequency as the vibration body; and
   a bias power source connected to the vibration body and the electrode and operable to generate an electrostatic field between the vibration body and the electrode;
   the vibration body being operable to resonantly vibrate when a voltage change at resonant frequency is provided between the vibration body and the electrode.

6. A mechanical resonator comprising:
   a vibration body operable to perform mechanical resonant vibration;
   an electrode located in a vicinity of the vibration body and operable to vibrate in a resonance mode at a same resonant frequency as the vibration body; and
   a detection section operable to detect a signal from a voltage change between the electrode and the vibration body;
   wherein the detecting section is operable to detect a signal converted from a vibration body into an electric signal due to an electrostatic capacitance change between the vibration body and the electrode during vibration of the vibration body.

* * * * *